United States Patent
Shabra et al.

(10) Patent No.: US 10,855,299 B2
(45) Date of Patent: Dec. 1, 2020

(54) RESISTIVE DAC WITH SUMMING JUNCTION SWITCHES, CURRENT OUTPUT REFERENCE, AND OUTPUT ROUTING METHODS

(71) Applicant: MEDIATEK Singapore Pte. Ltd., Singapore (SG)

(72) Inventors: Ayman Shabra, San Jose, CA (US); Michael A Ashburn, Jr., San Jose, CA (US); Patrick Cooney, San Jose, CA (US); Adalberto Cantoni, San Jose, CA (US); Joshua M. Bamford, San Jose, CA (US)

(73) Assignee: MEDIATEK Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/556,070

(22) Filed: Aug. 29, 2019

(65) Prior Publication Data

US 2020/0112317 A1    Apr. 9, 2020

Related U.S. Application Data

(60) Provisional application No. 62/728,130, filed on Sep. 7, 2018.

(51) Int. Cl.
*H03M 1/06*       (2006.01)
*H03F 3/45*       (2006.01)
(Continued)

(52) U.S. Cl.
CPC ............ *H03M 1/0607* (2013.01); *H03F 1/56* (2013.01); *H03F 3/45* (2013.01); *H04R 3/00* (2013.01);
(Continued)

(58) Field of Classification Search
CPC .......... H03M 1/0607; H03F 1/56; H03F 3/45; H04R 3/00
(Continued)

(56) References Cited

U.S. PATENT DOCUMENTS

| 7,092,043 | B2* | 8/2006 | Vorenkamp | ......... H01F 17/0006 |
| | | | | 257/E27.046 |
| 7,577,049 | B1* | 8/2009 | Kornachuk | .............. G11C 7/08 |
| | | | | 365/194 |

(Continued)

OTHER PUBLICATIONS

Extended European Search Report dated Jan. 29, 2020 in connection with European Application No. 19195925.3.
(Continued)

*Primary Examiner* — Lam T Mai
(74) *Attorney, Agent, or Firm* — Wolf, Greenfield & Sacks, P.C.

(57) ABSTRACT

Described herein are DACs with low distortion for high dynamic range (HDR), extremely high dynamic range (EHDR), and other suitable applications. Some embodiments relate to a device including a DAC configured for coupling to an amplifier via a force path and a sense path. For example, the DAC may provide output current to the amplifier via the force path, and the DAC may sense the input voltage of the amplifier via the sense path. Accordingly, distortion such as harmonic distortion and/or gain offset from parasitic impedances in the force and/or sense paths may be reduced or eliminated. Some embodiments relate to a DAC including a voltage reference generator configured to compensate for variations in impedances of the DAC, such as due to semiconductor process variation. Accordingly, distortion in the DAC output due to variations in the DAC impedances may be reduced or eliminated.

17 Claims, 10 Drawing Sheets

(51) Int. Cl.
*H03F 1/56* (2006.01)
*H04R 3/00* (2006.01)

(52) U.S. Cl.
CPC .............. *H03F 2200/03* (2013.01); *H03F 2203/45151* (2013.01); *H03F 2203/45526* (2013.01)

(58) Field of Classification Search
USPC ............... 341/118–155; 375/296, 344, 297; 455/77; 348/308
See application file for complete search history.

(56) References Cited

U.S. PATENT DOCUMENTS

| | | | | |
|---|---|---|---|---|
| 7,876,115 | B2* | 1/2011 | Stewart | G01R 31/2887 324/750.19 |
| 2008/0260066 | A1* | 10/2008 | Cai | H03F 1/3294 375/297 |
| 2010/0156472 | A1* | 6/2010 | Pellon | H04B 1/40 327/105 |
| 2010/0166123 | A1* | 7/2010 | Pellon | H03B 28/00 375/344 |
| 2013/0165055 | A1* | 6/2013 | Rossi | H03F 3/245 455/77 |
| 2014/0167996 | A1* | 6/2014 | Teterwak | H03M 1/0614 341/144 |
| 2016/0204781 | A1* | 7/2016 | Plusquellic | H04L 9/0866 326/8 |
| 2017/0100929 | A1* | 4/2017 | Nozawa | B41J 2/04588 |
| 2019/0268076 | A1* | 8/2019 | Awadalla | H04J 14/0298 |

OTHER PUBLICATIONS

Billa et al., Analysis and design of continuous-time delta-sigma converters incorporating chopping, IEEE J. Solid-State Circuits, vol. 52, No. 9, Sep. 2017, pp. 2350-2361.

Galton, I., Spectral Shaping of Circuit Errors in Digital-to-Analog Converters, IEEE, Transactions on Circuits and Systems—II, vol. 44, No. 10, Oct. 1997, pp. 808-817.

Hardy et al., A Partial Tree Vector Quantizer Dynamic Element Matching Technique for Audio ΔΣ Converters, CICC 2011, 4 pages.

Johns et al., Nyquist-Rate D/A Converters, In: Analog Integrated Circuit Design, Jan. 1, 1997, John Wiley & Sons, Inc., pp. 463-486.

Lin et al., A low noise single-transistor transimpedance preamplifier for Fourier-transform mass spectrometry using a T feedback network, Review of Scientific Instruments, vol. 83, No. 9, Sep. 1, 2012, 7 pages.

Risbo et al., Digital Approaches to ISI-Mitigation in High-Resolution Oversampled Multi-Level D/A Converters, IEEE Journal of Solid-State Circuits, vol. 46, No. 12, Dec. 2011, pp. 2892-2903.

Sanyal et al., Dynamic element matching with signal-independent element transition rates for multibit ΔΣ modulators, IEEE Transactions on Circuits and Systems—I, vol. 62, No. 5, May 2015, pp. 1325-1334.

Schreier et al., Noise-shaped multbit D/A convertor employing unit elements, Electronic Letters, vol. 31, No. 20, Sep. 1995, pp. 1712-1713.

Shettigar et al., Design techniques for wideband signle-bit continuous-time ΔΣ modulators with FIR feedback DACs, IEEE Journal of Solid-State Circuits, vol. 47, No. 12, Dec. 2012, pp. 2865-2879.

Sun et al., Low-complexity high-order vector-based mismatch shaping in multibit ΔΣ ADCs, IEEE Transactions on Circuits and Systems—II, vol. 58, No. 12, Dec. 2011, pp. 872-876.

Sun, N., High-order mismatch-shaping in multibit DACs, IEEE Transactions on Circuits and Systems—II, vol. 58, No. 6, Jun. 2011, pp. 346-350.

Westerveld et al., A 115dB-DR audio DAC with −61dBFS out-of-band noise, ISSCC Dig. Tech. Papers, Feb. 2015, 3 pages.

Yasuda et al., A 100kHz 9.6mW Multi-bit ΔΣ DAC and ADC using Noising Shaping Dynamic Elements Matching with Tree Structure, ISSCC Dig. Tech. Papers, Feb. 1998, pp. 64-65.

EP 19195925.3, Jan. 29, 2020, Extended European Search Report.

[No Author Listed], Acoustics—Normal equal-loudness-level-contours. ISO 226:2003(E). Aug. 15, 2003:26 pages.

Baird et al., Linearity enhancement of multibit ΔΣ A/D and D/A converters using data weighted averaging. IEEE Transactions on Circuits and Systems II: Analog and Digital Signal Processing. Dec. 1995;42(12):753-62.

Johns et al., Nyquist-rate D/A converters. University of Toronto. 1997. https://web.archive.org/web/20100704210125/http://www.eecg.toronto.edu/~johns/ece1371/slides/12_nyquist_da.pdf, retrieved on Jun. 18, 2020, noting date of Jul. 43, 2010. 10 pages.

O'Brien et al., A reduced hardware ISI and mismatch shaping DEM Decoder. Circuits, Systems, and Signal Processing. Jun. 1, 2018;37(6):2299-317.

Pestana et al., Spectral characteristics of popular commercial recordings 1950-2010. Audio Engineering Society Convention 135. Oct. 17-20, 2013:1-7.

Scharer et al., Evaluation of equalization methods for binaural signals. Audio Engineering Society Convention 126. May 7-10, 2009:1-17.

Terada et al., 126DB D-Range Current-Mode Advanced Segmented DAC. Audio Engineering Society Conference: UK 16th Conference: Silicon for Audio Apr. 1, 2001:76-81.

* cited by examiner

RESISTIVE DAC WITH SUMMING JUNCTION SWITCHES, CURRENT OUTPUT REFERENCE, AND OUTPUT ROUTING METHODS

CROSS-REFERENCE TO RELATED APPLICATIONS

This application claims priority to U.S. provisional application Ser. No. 62/728,130, filed Sep. 7, 2018, entitled "RESISTIVE DAC WITH SUMMING JUNCTION SWITCHES, CURRENT OUTPUT REFERENCE, AND OUTPUT ROUTING METHODS," which is hereby incorporated by reference in its entirety.

BACKGROUND

Digital to analog converters (DACs) are known electronic devices for converting a digital signal to an analog signal. Digital signals are typically encoded in discrete bits to be processed periodically at a clock frequency, whereas analog signals may be continuous in time. Media such as audio recordings are often stored and/or processed in a digital format and are provided to speakers in an analog format to be converted to sound waves. Accordingly, a DAC may be employed to convert the media to an analog format before outputting the media to the speakers.

BRIEF SUMMARY

Some embodiments relate to a digital-to-analog converter (DAC) comprising a first output current generator configured to generate, based on a first reference voltage, a first output current, and a first switch coupled to the first output current generator. The first switch may be configured for coupling to an input of an amplifier through a sense path and configured for coupling to an output of the amplifier through a force path. The DAC may be configured to sense a voltage at the input through the sense path, the first switch may be configured to provide the first output current to the output through the force path.

In some embodiments, the first output current generator may comprise a first resistor having a first end coupled to the first switch and a second end configured for coupling to the first reference voltage.

In some embodiments, the first output current generator may comprise a first capacitor having a first end coupled to the first switch and a second end configured for coupling to the first reference voltage.

In some embodiments, the first output current generator may comprise a current source having a control terminal configured to be biased by the first reference voltage and a channel terminal coupled to the first switch and configured to provide the first output current thereto.

In some embodiments, the sense path may comprise a first impedance including an input impedance of the amplifier, the force path may comprise a second impedance including a resistor coupled between the first switch and the output, and the first impedance may be greater than the second impedance.

In some embodiments, the DAC may further comprise one or more semiconductor dies, having the first output current generator and the first switch formed thereon, and the amplifier. The amplifier may be external to the one or more semiconductor dies and coupled to the one or more semiconductor dies through the force path and the sense path.

In some embodiments, first portions of the force and sense paths may be configured in a star configuration and second portions of the force and sense paths may be configured in a tree configuration, with the first portions positioned between the first switch and the second portions.

In some embodiments, the DAC may further comprise a second output current generator configured to generate, based on a second reference voltage, a second output current, and a second switch coupled to the second output current generator. The second switch may be configured for coupling to the input of the amplifier through the sense path and configured for coupling to the output of the amplifier through the force path. The first portions may couple the first switch to the second switch, and the second portions may be configured to couple the first portions to the amplifier.

In some embodiments, the first switch and the second switch each may be coupled to a summing junction configured to provide a combined output current to the output of the amplifier, and the combined output current may include the first and second output currents.

In some embodiments, the DAC may be configured to convert a plurality of bits to an analog signal, the first output current may be configured to represent a first bit of the plurality of bits, and the second output current may be configured to represent a second bit of the plurality of bits.

In some embodiments, the DAC may further comprise third and fourth output current generators configured to generate, based on third and fourth reference voltages, third and fourth output currents, and third and fourth switches coupled to the third and fourth output current generators. The third and fourth switches each may be coupled to the summing junction and configured such that the combined output current further includes the third and fourth output currents.

Some embodiments relate to a digital-to-analog converter (DAC) comprising an output current generator configured to generate an output current based on a reference voltage and a reference voltage generator configured to generate and adapt the reference voltage to compensate for an impedance of the output current generator.

In some embodiments, the DAC may further comprise one or more semiconductor dies, having formed thereon the output current generator and the reference voltage generator, and the reference voltage generator may be configured to adapt the reference voltage to compensate for variations in the impedance due to process variations of the one or more semiconductor dies.

In some embodiments, the DAC may further comprise a second impedance external to the one or more semiconductor dies and configured to set the reference voltage.

In some embodiments, the second impedance may comprise a resistor.

In some embodiments, the second impedance may comprise a capacitor.

In some embodiments, the DAC may further comprise a plurality of output current generators and a plurality of reference voltage generators. The plurality of output current generators may include the output current generator and a second output current generator configured to generate a second output current based on a second reference voltage. The plurality of reference voltage generators may include the reference voltage generator and a second reference voltage generator configured to generate and adapt the second reference voltage to compensate for an impedance of the second output current generator.

In some embodiments, the plurality of output current generators may comprise unary-weighted resistors each having a first end coupled to at least one of a plurality of reference voltages. The plurality of reference voltages may include the reference voltage and the second reference voltage. The plurality of reference voltage generators may be configured to thermometer-encode the plurality of reference voltages.

In some embodiments, the DAC may further comprise a plurality of switches coupled between the plurality of resistors and a summing junction. The summing junction may be configured for coupling to an amplifier so as to provide a combined output current to the amplifier. The combined output current may include the output current and the second output current.

In some embodiments, the DAC may further comprise a current mirror, including a first side having the reference voltage generator thereon, the reference voltage generator being configured to produce the reference voltage on the first side, and a second side having the output current generator thereon, the current mirror being configured to reproduce the reference voltage on the second side for the output current generator.

The foregoing summary is provided by way of illustration and is not intended to be limiting.

DETAILED DESCRIPTION

It is desirable for a DAC to have a high dynamic range (HDR). Dynamic range is the ratio from the highest power level a system is configured to process to the lowest power level the system is configured to process. For example, a system having 90 decibels (dB) of dynamic range may process signals at power levels up to one billion times its lowest acceptable power level. Signals outside the dynamic range of a system may be impacted by distortion or noise from the system, compromising the integrity of the signals and resulting in errors. Such errors may include clipping in the output of an audio system. For example, in some audio applications, high and low frequency components of an audio signal (e.g., bass and treble components) may have very different power levels (e.g., bass power levels may be orders of magnitude higher than treble power levels), and so an audio system with insufficient dynamic range may distort (e.g., clip) some components of the audio signal that lie outside the system's dynamic range. Other such systems may be configured to omit signals having power levels too high or too low for the system, causing a listener to not hear the omitted signals. Accordingly, it is desirable for systems to accommodate components of a signal at a wide range of power levels without distorting any of the components. Systems with >120 dB of dynamic range are typically referred to as extremely high dynamic range (EHDR) systems.

The inventors have developed DACs having low distortion, which may be suitable for HDR and/or EHDR applications. Some embodiments relate to a device including a DAC coupled to an amplifier via a force path and a sense path. The inventors recognized that, if output current is provided to the amplifier through a combined force and sense path, parasitic impedances in the combined path may distort the resulting output voltage at the output of the amplifier. To solve this problem, DACs described herein may include separate force and sense paths, such that parasitic impedances in the sense path may have little to no impact on the sensing capability of the DAC, resulting in little to no resulting distortion in the output voltage. Some embodiments relate to a DAC including a voltage reference generator configured to compensate for variations in impedances of the DAC, such as due to semiconductor process variation. For example, the voltage reference generator may synchronize the on-chip impedances of the DAC with the off-chip impedances of an amplifier coupled to the DAC. Accordingly, distortion in the DAC output due to variations in the DAC impedances may be reduced or eliminated. It should be appreciated that techniques described herein may be implemented alone or in combination. Further, techniques described herein may be implemented in applications other than HDR or EHDR applications, such as in low noise radio frequency (RF) transmission systems, or other suitable applications.

Figure 1:
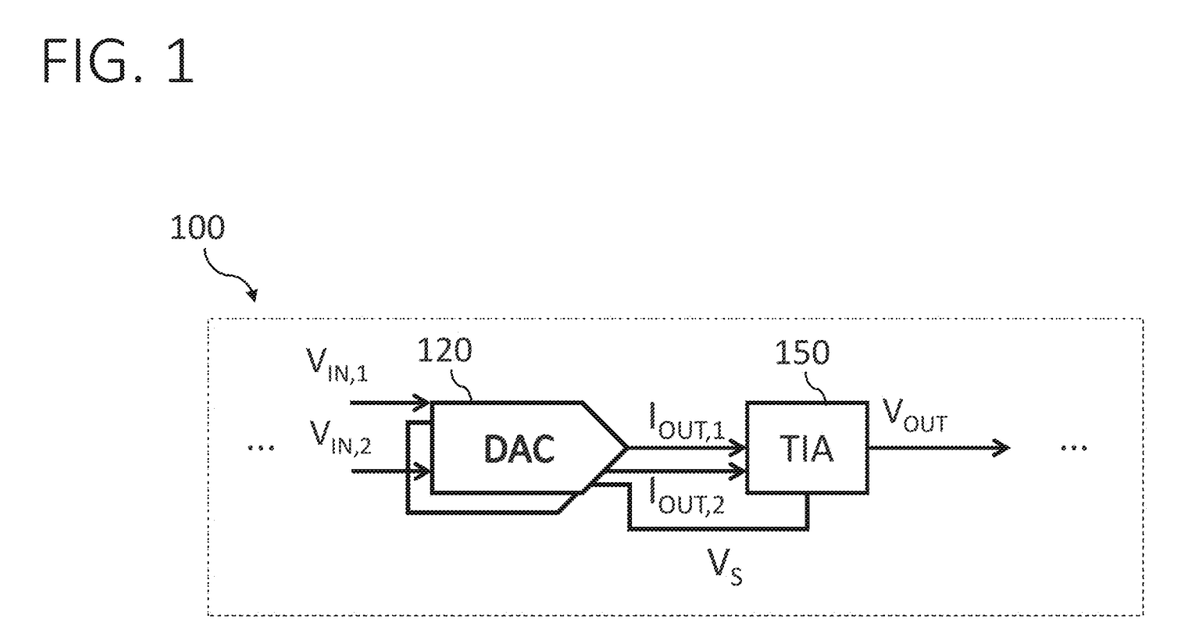
FIG. 1 is a block diagram illustrating an exemplary system including a DAC and an amplifier, in accordance with some embodiments.
Figure 2:
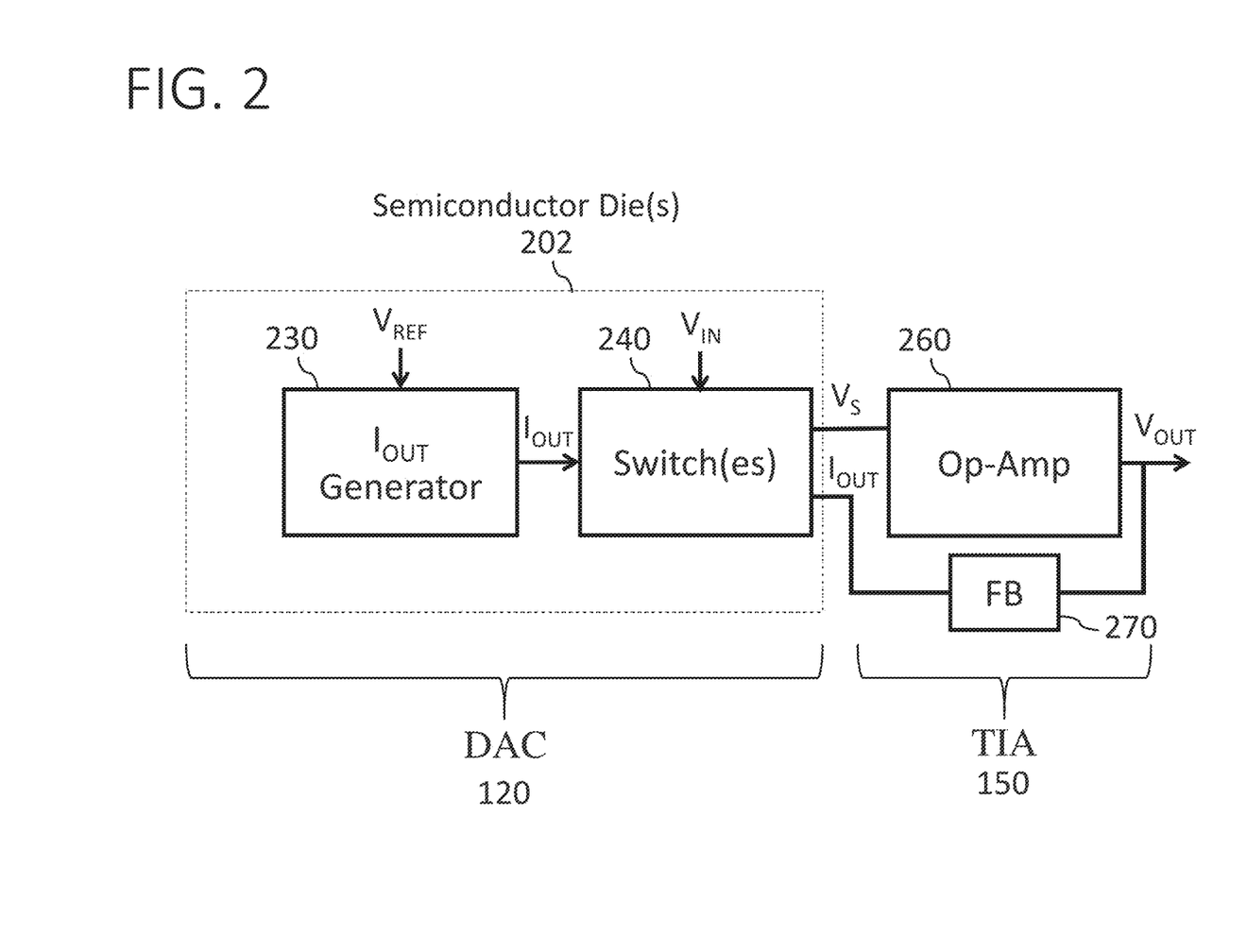
FIG. 2 is a block diagram illustrating the DAC and amplifier of FIG. 1, in accordance with some embodiments.

FIGS. 1-2 illustrate an overview of system 100 including DAC 120 and amplifier 150.

FIG. 1 is a block diagram illustrating exemplary system 100 including DAC 120 and amplifier 150, in accordance with some embodiments. DAC 120 may be configured to receive and convert input signals $V_{IN,1}$ and $V_{IN,2}$ into output currents $I_{OUT,1}$ and $I_{OUT,2}$. In some embodiments, input signals $V_{IN,1}$ and $V_{IN,2}$ may include digital bits. Amplifier 150, which is illustrated as a trans-impedance amplifier (TIA) in FIG. 1, may be configured to receive a sum of output currents $I_{OUT,1}$ and $I_{OUT,2}$ and generate analog output voltage $V_{OUT}$ based on the sum of output currents $I_{OUT,1}$ and $I_{OUT,2}$. For example, output currents $I_{OUT,1}$ and $I_{OUT,2}$ may flow through a force path of DAC 120 to a feedback impedance of amplifier 150, such as a resistor, and on to an output of amplifier 150 to generate $V_{OUT}$ at the output. Amplifier 150 may provide sense voltage $V_S$ to DAC 120. For example, DAC 120 may receive sense voltage $V_S$ by sensing a voltage at an input of amplifier 150 via a sense path.

In some embodiments, system 100 may be an EHDR system, such as a high performance audio system. For example, system 100 may further include a modulator (e.g., delta-sigma modulator) and/or a data weighted averaging (DWA) module coupled to DAC 120 and configured to generate input voltages $V_{IN,1}$ and $V_{IN,2}$. Accordingly, DAC 120 and amplifier 150 may generate an analog audio signal from a digital audio bitstream represented by $V_{IN,1}$ and $V_{IN,2}$. For example, amplifier 150 may provide $V_{OUT}$ based on a sum of $I_{OUT,1}$ and $I_{OUT,2}$, to a speaker to produce sound waves corresponding to the analog audio signal. Alternatively, in some embodiments, system 100 may be a transmission system. For example, a data packet may be provided as input voltages $V_{IN,2}$ and $V_{IN,2}$, and DAC 120 and amplifier 150 may provide an analog signal indicative of the data packet to a mixer and/or power amplifier to be transmitted over an antenna.

It should be appreciated that DAC 120 may be configured to receive any number of input voltages $V_{IN}$ and generate any suitable number of output currents $I_{OUT}$.

FIG. 2 is a block diagram illustrating DAC 120 and amplifier 150 of FIG. 1, in accordance with some embodiments. In the illustrative embodiment of FIG. 2, DAC 120 includes output current generator 230 and one or more switches 240. Amplifier 150 includes operational amplifier (Op-Amp) 260 and feedback circuitry 270.

During operation of system 100, output current generator 230 may generate one or more output currents $I_{OUT}$ based on at least one reference voltage $V_{REF}$. Reference voltage $V_{REF}$ may be provided to DAC 120 from another component of system 100. Alternatively, in some embodiments, DAC 120 further includes a reference voltage generator configured to generate reference voltage(s) $V_{REF}$, as described further herein including with reference to FIGS. 5-6.

Switch(es) 240 may provide output current $I_{OUT}$ to amplifier 150 depending on a binary state of $V_{IN}$. For example, input voltage $V_{IN}$ may turn switch(es) 240 on or off to cause output current(s) $I_{OUT}$ to flow or not to flow to amplifier 150. Feedback circuitry 270 may convert output current(s) $I_{OUT}$ to analog output voltage $V_{OUT}$. For example, feedback circuitry 270 may include an impedance that produces output voltage $V_{OUT}$ at the output of Op-Amp 260 responsive to output current(s) $I_{OUT}$ flowing through the impedance. An input of Op-Amp 260 may provide sense voltage $V_S$ for feedback control of output voltage $V_{OUT}$. For example, sense voltage $V_S$ may control a voltage across feedback circuitry 270, thus impacting the value of output voltage $V_{OUT}$ produced from output current(s) $I_{OUT}$.

In the illustrative embodiment of FIG. 2, DAC 120 is formed on one or more semiconductor dies 202, and amplifier 150 is external to semiconductor die(s) 202. For example, amplifier 150 may be formed on one or more different semiconductor dies from DAC 120. It should be appreciated that, in some embodiments, DAC 120 and amplifier 150 may be formed on a same semiconductor die or on multiple common semiconductor dies.

FIGS. 3A-3E are circuit diagrams illustrating various embodiments of DAC 120 and amplifier 150. In FIGS. 3A-3E, DAC 120 is coupled to amplifier 150 via separate force and sense paths.

Figure 3A:
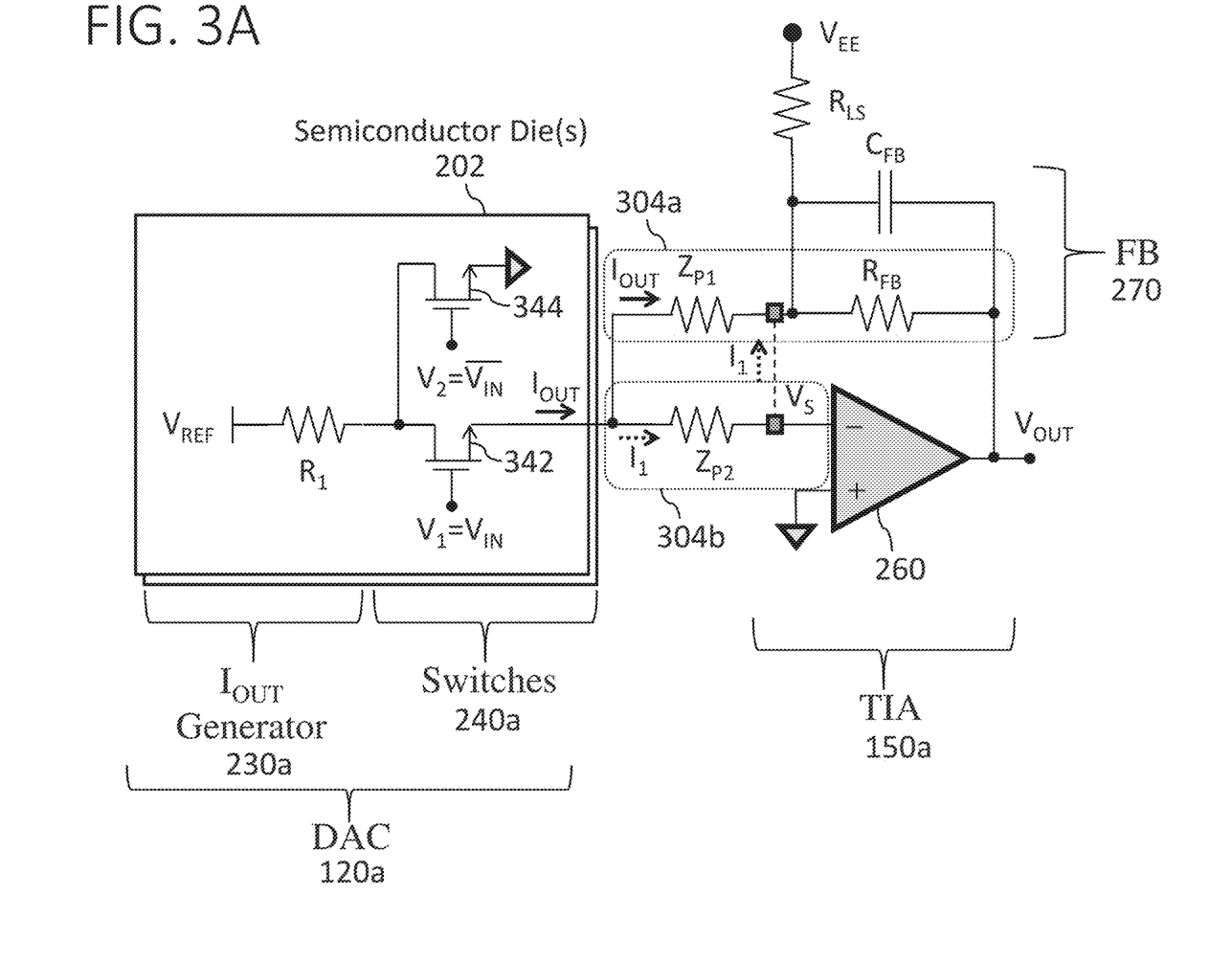
FIG. 3A is a circuit diagram illustrating a DAC including a resistive output current generator and one or more switches, in accordance with some embodiments.

FIG. 3A is a circuit diagram illustrating DAC 120a including resistive output current generator 230a and switches 240a, in accordance with some embodiments.

In FIG. 3A, output current generator 230a includes resistor $R_1$ coupled between reference voltage $V_{REF}$ and switches 240a. A value of output current $I_{OUT}$ generated by output current generator 230a may be controlled by setting a value for reference voltage $V_{REF}$ and/or based on the selection of resistor $R_1$.

In FIG. 3A, switches 240a include switch 342 coupled between resistor $R_1$ and amplifier 150a, and switch 344 coupled between resistor $R_1$ and ground. Switches 342 and 344 may include transistors, such as n-channel metal oxide semiconductor field effect transistors (MOSFETs). A control terminal of switch 342 is coupled to input voltage $V_{IN}$, and a control terminal of switch 344 is coupled to the inverse of input voltage $V_{IN}$. For example, when input voltage $V_{IN}$ is high, resistor $R_1$ may be coupled to amplifier 150a, and output current $I_{OUT}$ may flow through switch 342 to amplifier 150a to generate output voltage $V_{OUT}$ based on output current $I_{OUT}$. Alternatively, when input voltage $V_{IN}$ is low, resistor $R_1$ may be coupled to ground, and output current $I_{OUT}$ may flow through switch 344 to ground. Accordingly, output voltage $V_{OUT}$ may be zero when input voltage $V_{IN}$ is low.

It should be appreciated that switches 240a may alternatively or additionally include any number of p-channel and/or n-channel MOSFETs, and/or other types of transistors such as bipolar junction transistors (BJTs), heterojunction bipolar transistors (HBTs), high electron mobility transistors (HEMTs), and/or other suitable transistors.

A negative input of Op-Amp 260 provides sense voltage $V_S$ to DAC 120a. For example, because the positive input of Op-Amp 260 is coupled to ground, the negative input of Op-Amp 260 may be very close to ground (e.g., +/-a few microvolts). Accordingly, the voltage $V_S$ may hold the voltage between switches 240a and amplifier 150a close to ground.

Feedback circuitry 270 includes feedback resistor $R_{FB}$ and feedback capacitor $C_{FB}$. Feedback resistor $R_{FB}$ may convert $I_{OUT}$ to $V_{OUT}$, and feedback capacitor $C_{FB}$ may block high frequency switching components of $I_{OUT}$ from the output of Op-Amp 260.

In FIG. 3A, DAC 120a is coupled to amplifier 150a via force path 304a and sense path 304b. Force path 304a may include parasitic impedance $Z_{P1}$, feedback circuitry 270, and the output of Op-Amp 260. Sense path 304b may include parasitic impedance $Z_{P2}$ and the negative input of Op-Amp 260. Parasitic impedances $Z_{P1}$ and $Z_{P2}$ may include impedances in wire connections (e.g., bond wires and/or cable wires) between DAC 120a and amplifier 150a, and may include resistive, inductive, and/or capacitive components.

The inventors recognized that, by coupling DAC 120 to amplifier 150 via separate force and sense paths 304a and 304b, distortion due to parasitic impedance $Z_{P2}$ along sense path 304b may be reduced or eliminated. As shown in FIG. 3A, without force and sense paths 304a and 304b, output current $I_1$ flows through a single path from switches 240a to feedback circuitry 270. For example, output current $I_1$ may flow through parasitic impedance $Z_{P2}$ to feedback circuitry 270 along the dashed line. As a result, output current $I_1$ may cause distortion when flowing through parasitic impedance $Z_{P2}$ to feedback circuitry 270. For example, output current $I_1$ may cause a voltage drop across parasitic impedance $Z_{P2}$, causing a change in output voltage $V_{OUT}$ and resulting in harmonic distortion. However, by implementing separate force and sense paths 304a and 304b, substantially all of output current $I_{OUT}$ may flow through force path 304a to feedback circuitry 270 via parasitic impedance $Z_{P1}$, with little to no current flowing through parasitic impedance $Z_{P2}$ in sense path 304b. In some embodiments, DAC 120a and amplifier 150a may be configured such that the impedance of force path 304a is lower than that of sense path 304b. For example, sense path 304b may include an input impedance of Op-Amp 260, which may be high (e.g., higher than feedback resistor $R_{FB}$ and/or feedback capacitor $C_{FB}$). As a result of separate force and sense paths 304a and 304b, parasitic impedance $Z_{P2}$ may have a reduced voltage thereacross, resulting in less distortion in output voltage $V_{OUT}$, as compared to previous DACs.

Figure 3B:
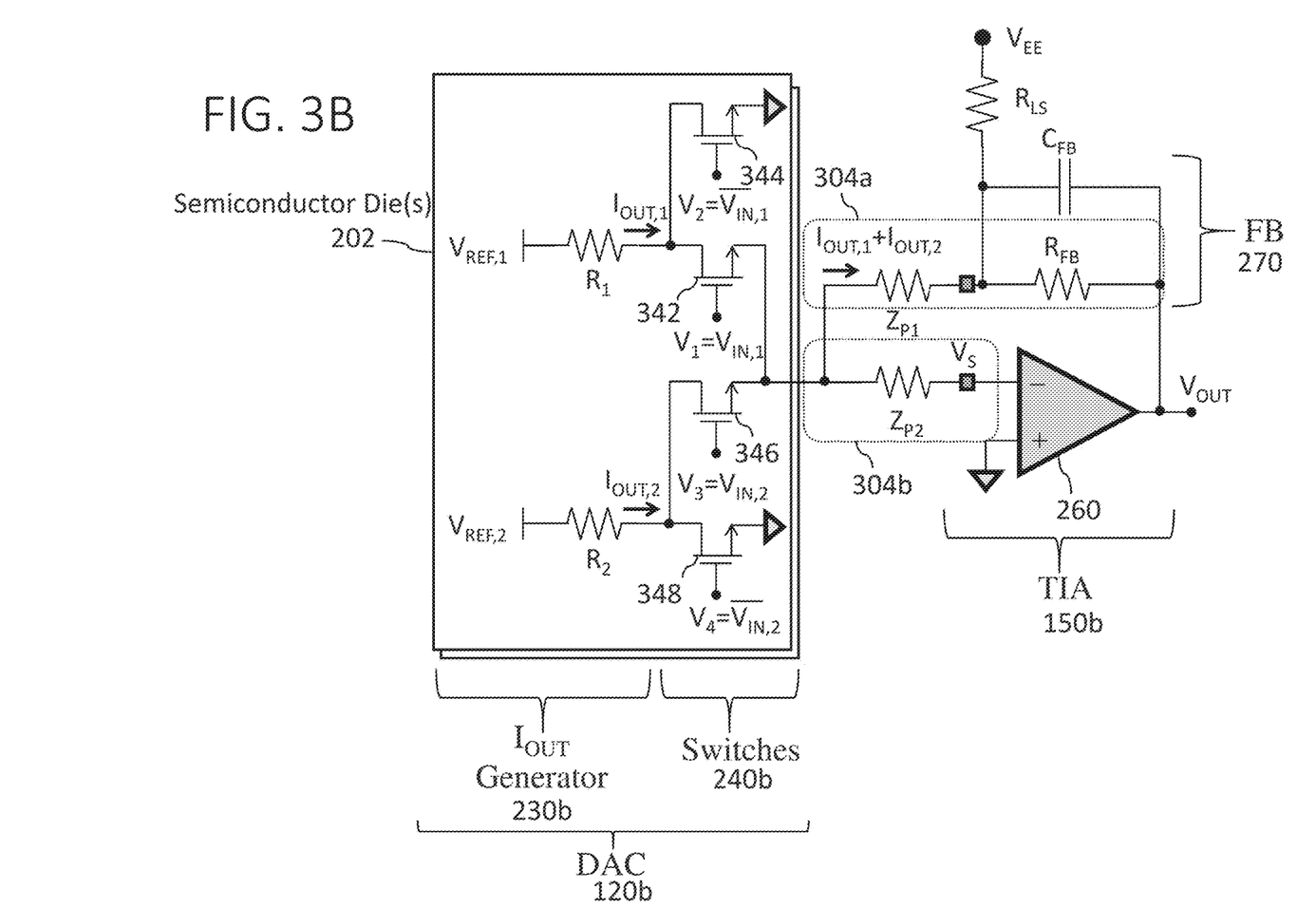
FIG. 3B is a circuit diagram illustrating a DAC including a multi-level, resistive output current generator and one or more switches, in accordance with some embodiments.

FIG. 3B is a circuit diagram illustrating DAC 120b including multi-level, resistive output current generator 230b and switches 240b, in accordance with some embodiments. As in FIG. 3A, DAC 120b is coupled to amplifier 150b via force path 304a and sense path 304b. Amplifier 150b may be configured in the manner described for amplifier 150a in connection with FIG. 3A. DAC 120b may be configured to generate output currents $I_{OUT,1}$ and $I_{OUT,2}$ such that amplifier 150b may produce output voltage $V_{OUT}$ based on a sum of output currents $I_{OUT,1}$ and $I_{OUT,2}$.

In FIG. 3B, output current generator 230b includes resistors $R_1$ and $R_2$ coupled to reference voltages $V_{REF,1}$ and $V_{REF,2}$. In some embodiments, resistors $R_1$ and $R_2$ may be unary-weighted (e.g., having substantially equal resistance values). In some embodiments, DAC 120 may be configured such that reference voltages $V_{REF,1}$ and $V_{REF,2}$ have different voltage values. For example, reference voltages $V_{REF,1}$ and $V_{REF,2}$ may be thermometer-encoded, with $V_{REF,1}$ having a high voltage (e.g., 5V) and with $V_{REF,2}$ having a low voltage (e.g., 0V). Resistor $R_1$ is coupled to switches 342 and 344, and resistor $R_2$ is coupled to switches 346 and 348.

Switches 240b may be configured to select and/or add output currents $I_{OUT,1}$ $I_{OUT,2}$ generated by output current generator 230b to provide a combined output current to amplifier 150b having one of multiple amplitude levels. Depending on a state of input voltages $V_{IN,1}$ and $V_{IN,2}$, output current $I_{OUT}$ provided to amplifier 150b may have one of at least two amplitude levels. For example, if input voltage $V_{IN,1}$ is high (e.g., logical 1) and input voltage $V_{IN,2}$ is low (e.g., logical 0), then output current $I_{OUT}$ may have a first amplitude level generated using reference voltage $V_{REF,2}$ and provided to amplifier 150b via switch 342. If input voltage $V_{IN,1}$ is low and input voltage $V_{IN,2}$ is high, then output current $I_{OUT}$ may have a second amplitude level generated using reference voltage $V_{REF,2}$ and provided to amplifier 150b via switch 346. In some embodiments, the second amplitude level may be zero, such as by providing little to no current to amplifier 150b. Combined output current $I_{OUT}$ may include a sum of output currents $I_{OUT,1}$ and $I_{OUT,2}$.

It should be appreciated that, in accordance with various embodiments, DAC 120b may be configured for any number of amplitude levels of output current $I_{OUT}$. For example, a third resistor may be coupled between reference voltage $V_{REF,1}$ and additional switches. The additional switches may be configured to receive a third input voltage $V_{IN}$ to generate an output current to be combined with output currents $I_{OUT,1}$ and/or $I_{OUT,2}$. For example, output current generator 230b may be thermometer-encoded, with one reference voltage at a low voltage (e.g., 0V) and the other reference voltages at a high voltage (e.g., 5V). It should be appreciated that any suitable high and/or low reference voltages may be used.

Figure 3C:
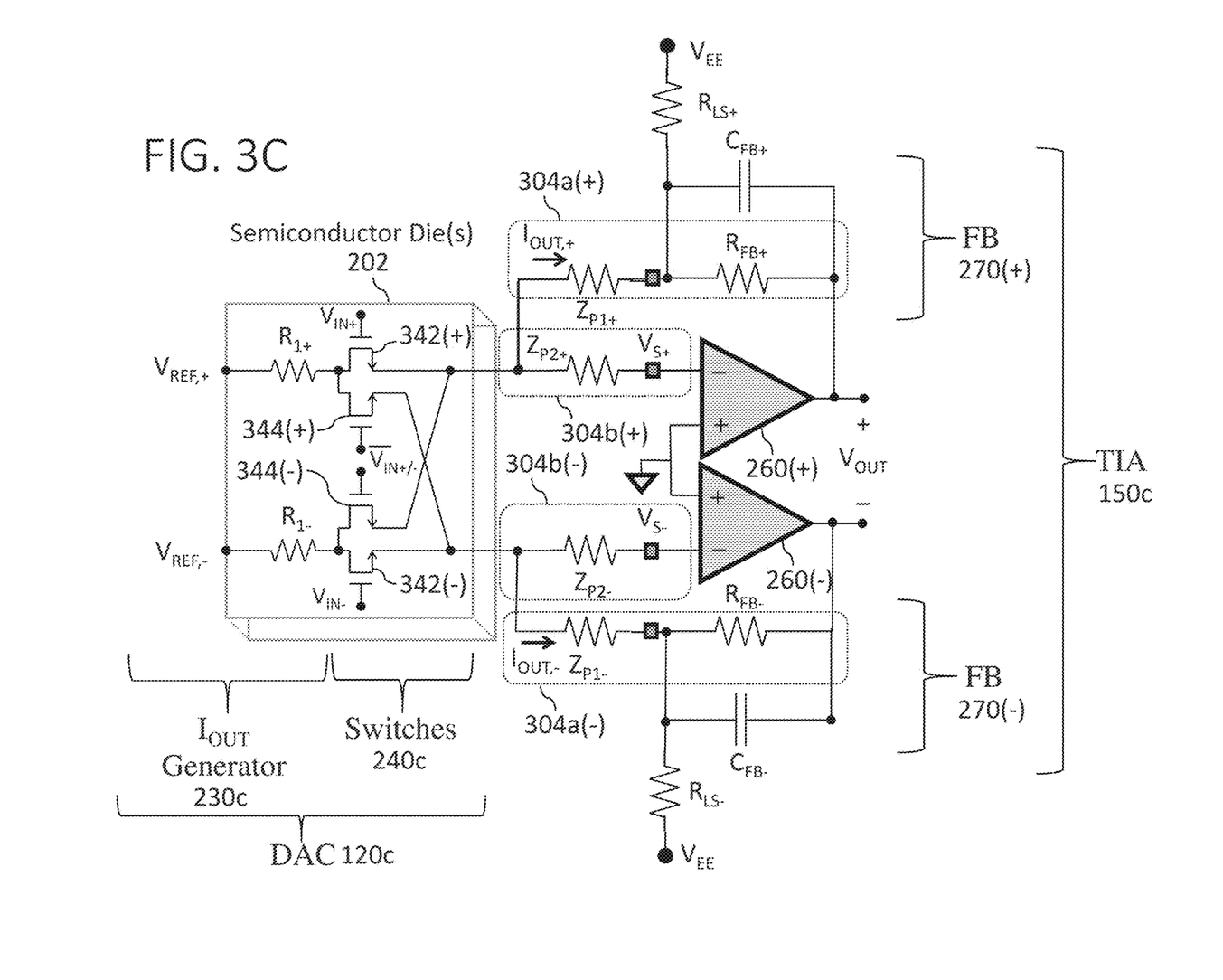
FIG. 3C is a circuit diagram illustrating a DAC including a differential, resistive output current generator and one or more switches, in accordance with some embodiments.

FIG. 3C is a circuit diagram illustrating DAC 120c including differential, resistive output current generator 230c and switches 240c, in accordance with some embodiments. DAC 120c may be configured to receive and convert differential input voltage components $V_{IN,+}$ and $V_{IN,-}$ into differential output current components $I_{OUT,-}$ and $I_{OUT,+}$. DAC 120c is coupled to amplifier 150c via positive and negative force paths 304a(+) and 304a(−), and via positive and negative sense paths 304b(+) and 304b(−) corresponding to the differential signal components.

Output current generator 230c includes resistors $R_{1+}$ and $R_{1-}$ coupled to reference voltages $V_{REF,+}$ and $V_{REF,-}$. In FIG. 3C, switches 240c include switches 342(+) and 342(−) configured to provide output current components $I_{OUT,30}$ and $I_{OUT,-}$ to respective Op-Amps 260(+) and 260(−). Switches 344(+) and 344(−) are configured to change the polarity of output voltage $V_{OUT}$ by providing output current components $I_{OUT,30}$ and $I_{OUT,-}$ to respective Op-Amps 260(−) and 260(+). It should be appreciated that, in some embodiments, switches 344(+) and 344(−) may be configured to block output current components $I_{OUT,+}$ and $I_{OUT,-}$ from reaching amplifier 150c, such that output voltage $V_{OUT}$ is zero when switches 344(+) and 344(−) are on and switches 342(+) and 342(−) are off.

Amplifier 150c includes Op-Amps 260(+) and 260(−) and feedback circuitries 270(+) and 270(−) for producing the positive and negative signal components of output voltage $V_{OUT}$ based on output current components $I_{OUT,+}$ and $I_{OUT,-}$ from DAC 120c.

In FIG. 3C, DAC 120c is coupled to amplifier 150c via positive and negative force paths 304a(+) and 304a(−), and via positive and negative sense paths 304b(+) and 304b(−). Positive force path 304a(+) may include parasitic impedance $Z_{P1+}$ and positive feedback circuitry 270(+), and negative force path 304a(−) may include parasitic impedance $Z_{P1-}$ and negative feedback circuitry 270(−) Likewise, positive sense path 304b(+) may include parasitic impedance $Z_{P2+}$ and the negative input of Op-Amp 260(+), and negative sense path 304b(−) may include parasitic impedance $Z_{P2-}$ and the negative input of Op-Amp 260(−).

It should be appreciated that, in some embodiments, DAC 120c may be configured for multiple amplitude levels of $I_{OUT}$, for example with multiple positive and negative reference voltages and suitable resistors for generating differential output current components for each amplitude level. Alternatively or additionally, in some embodiments, output current generator 230c may be thermometer-encoded.

Figure 3D:
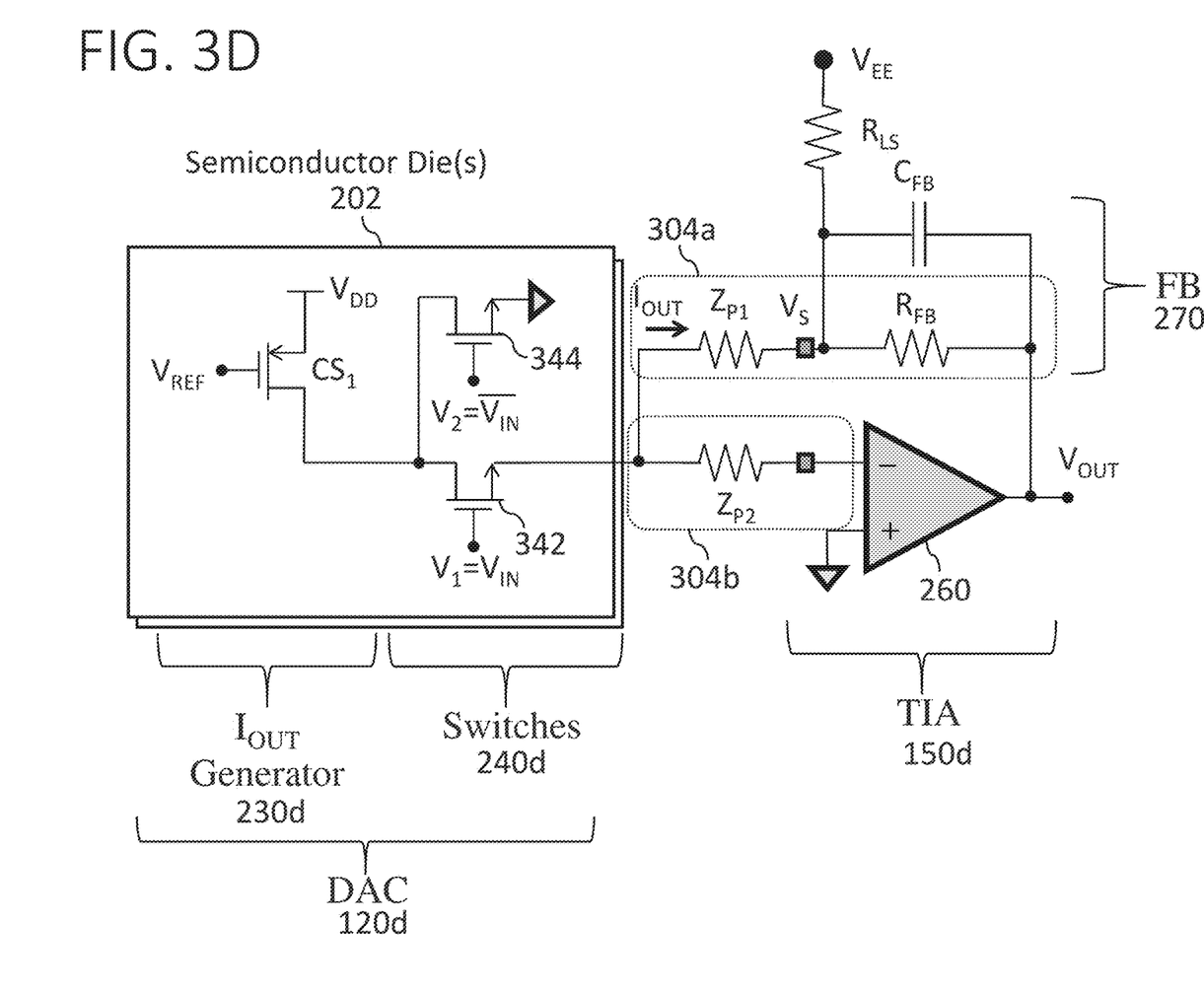
FIG. 3D is a circuit diagram illustrating a DAC including a current-based output current generator and one or more switches, in accordance with some embodiments.

FIG. 3D is a circuit diagram illustrating DAC 120d including current-based output current generator 230d and switches 240d, in accordance with some embodiments. As in FIGS. 3A-3B, DAC 120d is coupled to amplifier 150d via force and sense paths 304a and 304b. Amplifier 150d may be configured in the manner described for amplifier 150a in connection with FIG. 3A.

Output current generator 230d includes current source CSI configured to generate output current $I_{OUT}$. In some embodiments, current source CSI may include a transistor having a control terminal coupled to reference voltage $V_{REF}$, and channel terminals coupled to supply voltage $V_{DD}$ and switches 240d. For example, in FIG. 3D, current source $CS_1$ is a p-channel MOSFET with a gate biased by reference voltage $V_{REF}$, a source coupled to supply voltage $V_{DD}$, and a drain coupled to switches 240d. However, it should be appreciated that CSI may alternatively or additionally include any number of p-channel and/or n-channel MOSFETs, and/or other types of transistors such as bipolar junction transistors (BJTs), heterojunction bipolar transistors (HBTs), high electron mobility transistors (HEMTs), and/or other suitable transistors for generating output current $I_{OUT}$.

It should be appreciated that, in some embodiments, DAC 120d may be configured for multiple amplitude levels of output current $I_{OUT}$. For example, DAC 120d may include multiple current sources configured to generate suitable output currents for each amplitude level. Alternatively or additionally, in some embodiments, output current generator 230d may be thermometer-encoded. Alternatively or additionally, in some embodiments, DAC 120d may be configured for differential inputs and outputs. For example, DAC 120d may include current sources configured to generate differential output current components.

Figure 3E:
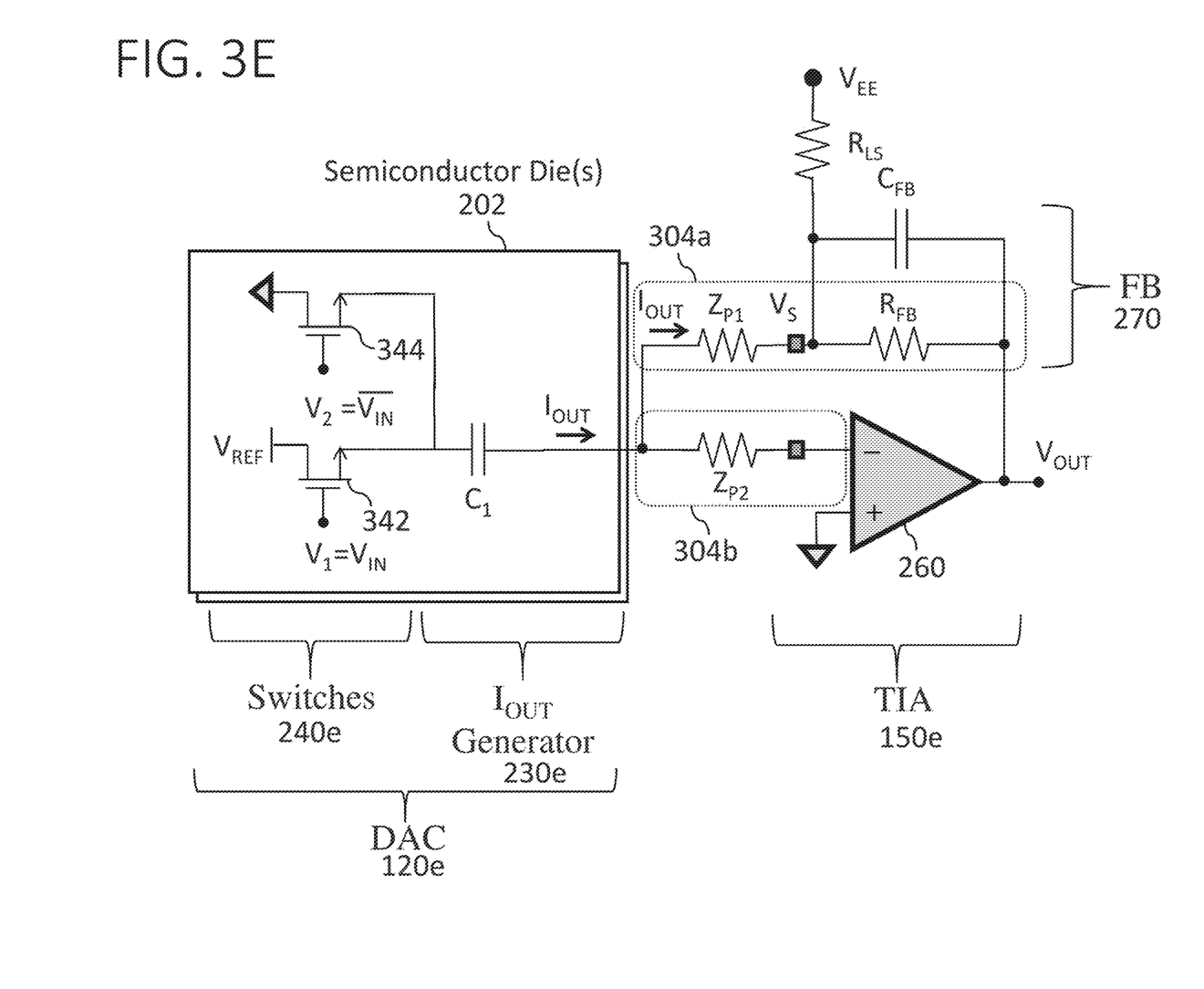
FIG. 3E is a circuit diagram illustrating a DAC including a capacitor-based output current generator and one or more switches, in accordance with some embodiments.

FIG. 3E is a circuit diagram illustrating DAC 120e including capacitor-based output current generator 230e and switches 240e, in accordance with some embodiments. As in FIGS. 3A-3B and 3D, DAC 120e is coupled to amplifier 150e via force and sense paths 304a and 304b. Amplifier 150e may be configured in the manner described for amplifier 150a in connection with FIG. 3A.

Output current generator 230e includes capacitor $C_1$ coupled to reference voltage $V_{REF}$ and switches 240e. Capacitor $C_1$ may configured to generate output current $I_{OUT}$. For example, when input voltage $V_{IN}$ is low, capacitor $C_1$ may be coupled to ground, resulting in substantially zero charge across capacitor $C_1$. Alternatively, when input voltage $V_{IN}$ is high, $C_1$ may be coupled to reference voltage $V_{REF}$, with charge across capacitor $C_1$ corresponding to the voltage across capacitor $C_1$. During a transition in input voltage $V_{IN}$ from high to low (or vice versa) charge may build up (or decay) across capacitor $C_1$, with the flow of the charge to or from capacitor $C_1$ resulting in output current $I_{OUT}$ flowing to amplifier 150e.

It should be appreciated that, in some embodiments, DAC 120e may be configured for multiple amplitude levels of output current $I_{OUT}$. In some embodiments, output current generator 230e may be thermometer-encoded. For example, output current generator 230e may include multiple capacitors coupled to multiple reference voltages to accommodate different numbers of amplitude levels of output current $I_{OUT}$. Alternatively or additionally, in some embodiments, DAC 120e may be configured for differential inputs and outputs. For example, DAC 120e may include capacitors for generating differential output current components.

Figure 4:
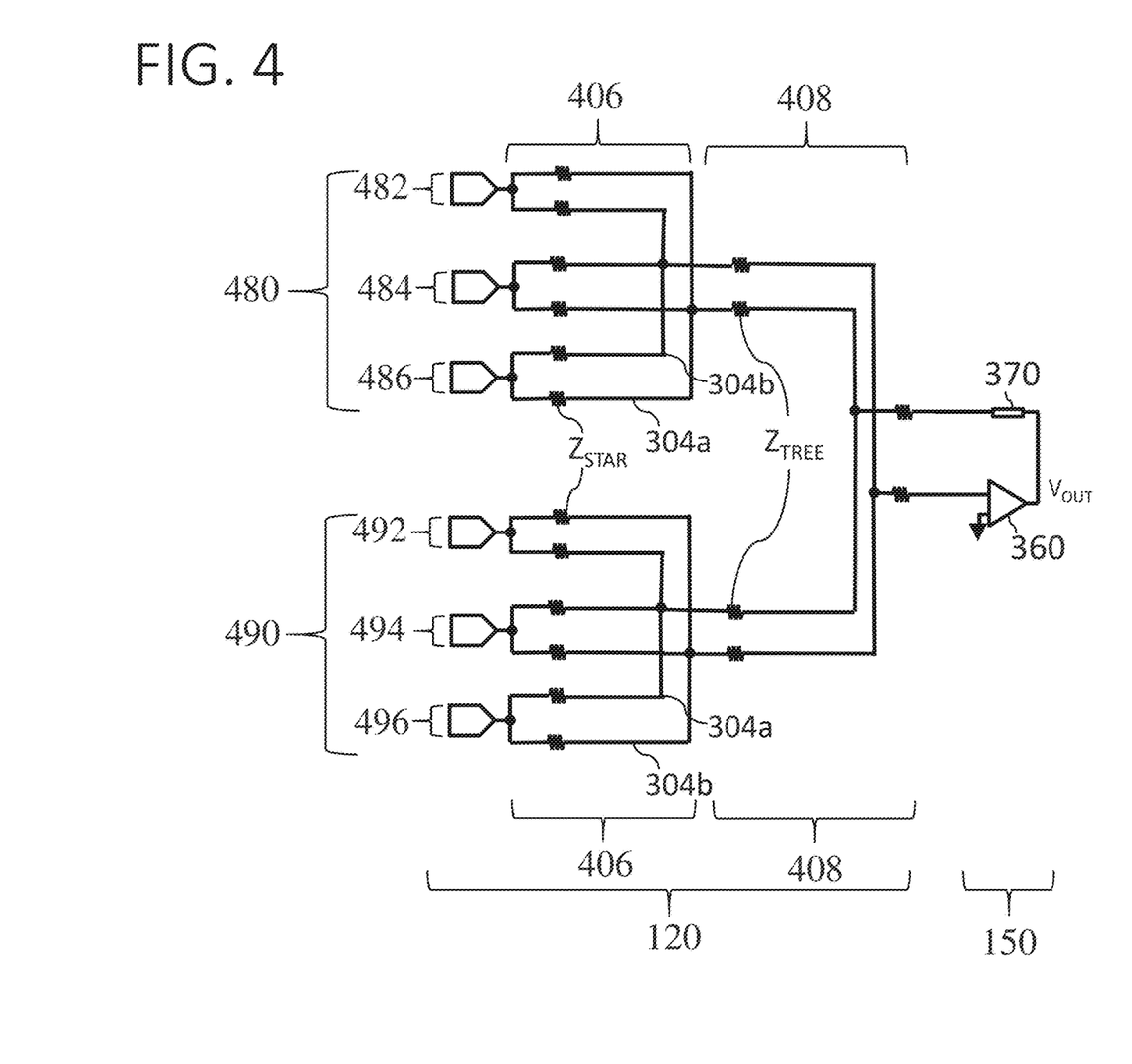
FIG. 4 is a circuit diagram illustrating a DAC having a low distortion output routing configuration, in accordance with some embodiments.

FIG. 4 is a circuit diagram illustrating DAC 120 having a low distortion output routing configuration, in accordance with some embodiments. In FIG. 4, DAC 120 includes segments 480 and 490. Segment 480 includes elements 482, 484, and 486, and segment 490 includes elements 492, 494 and 496. In some embodiments, segments 480 and 490 include multi-level output current generators and switches, such as output current generator 230b and switches 240b described herein including with reference to FIG. 3B. For example, element 482 may include resistor $R_1$ and switches 342 and 344, and element 484 may include resistor $R_2$ and switches 346 and 348. In some embodiments, elements 482, 484, and 486 may be thermometer-encoded. In some embodiments, segment 490 may be configured in the manner described for segment 480.

In FIG. 4, DAC 120 is configured in a low distortion output routing configuration which includes star configuration 406 connecting elements 482, 484, and 486 within segment 480 and elements 492, 494, and 496 within segment 490. Tree configuration 408 connects segments 480 and 490 to one another. The inventors recognized that, in embodiments with multiple (e.g., 16) segments each having many (e.g., 64) elements, the combined impact of distortion caused by voltage drops across the parasitic impedances in routing output current $I_{OUT}$ to amplifier 150 may impact performance of the DAC. To solve this problem, force and sense paths 304a and 304b within each segment 480 and 490 may be configured in star configuration 406, in which force and sense paths 304a and 304b may be routed to a common meeting point without any of the paths being joined en route to the common meeting point. For example, in star configuration 406, each output current $I_{OUT}$ component may flow through only one parasitic impedance $Z_{STAR}$. The inventors also recognized that tree configuration 408 may consume little space on a semiconductor die when connecting segments 480 and 490 to amplifier 150. Accordingly, force and sense paths 304a and 304b of segments 480 and 490 are connected in tree configuration 408.

Figure 5:
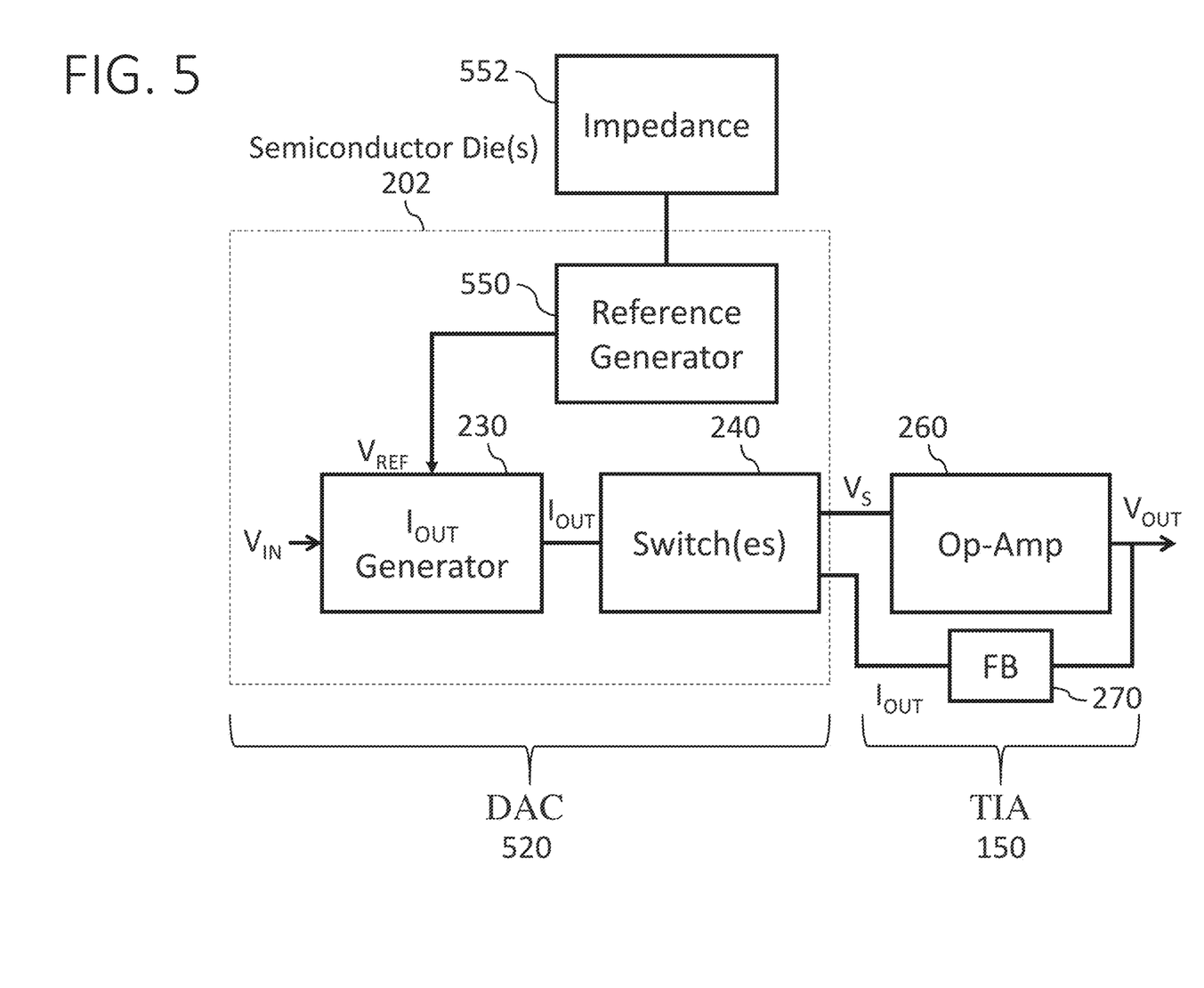
FIG. 5 is a block diagram illustrating DAC and amplifier, according to some embodiments.
Figure 6:
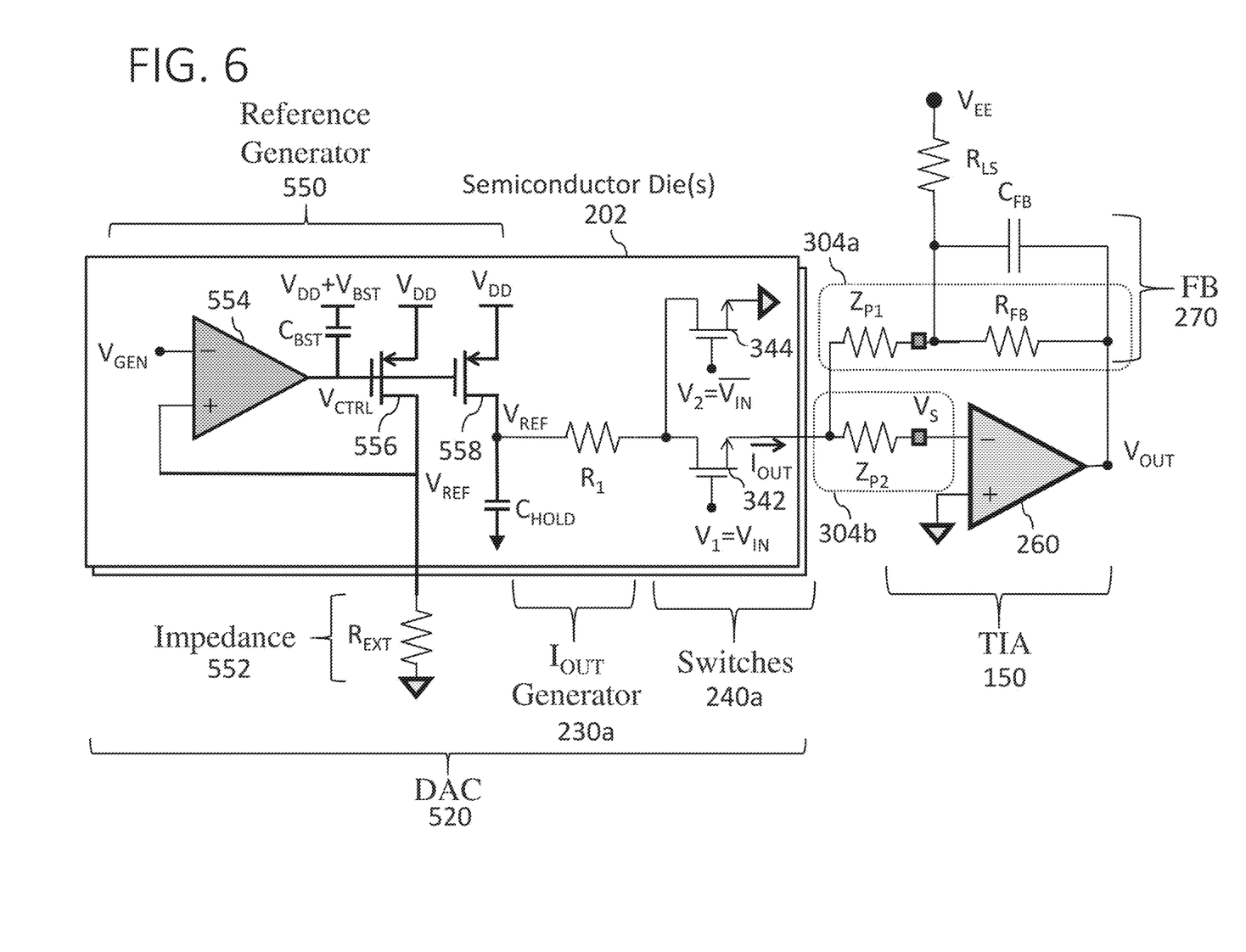
FIG. 6 is a circuit diagram illustrating the DAC of FIG. 5, in accordance with some embodiments.

FIGS. 5-6 illustrate DAC 520 including reference voltage generator 550, in accordance with some embodiments. Reference voltage generator 550 may be configured to generate reference voltage(s) $V_{REF}$ which compensate for variations in components of DAC 520 such as output current generator 230.

FIG. 5 is a block diagram illustrating DAC 520 and amplifier 150. DAC 520 includes output current generator 230 and switches 240, and also includes reference voltage generator 550 coupled to impedance 552. DAC 520 is coupled to amplifier 150, which may be configured in the manner described herein including with reference to FIGS. 1-4. Output current generator 230 and switches 240 of DAC 520 may be configured in the manner described herein including with reference to FIGS. 2-4. Reference voltage generator 550 may be configured to generate reference voltage $V_{REF}$ using impedance 552. In some embodiments, impedance 552 may include a resistor, a capacitor, and/or an inductor.

The inventors have recognized that variations (e.g., process variations) in semiconductor die(s) 202, such as in passive or active components formed thereon, may cause corresponding variations in reference voltage $V_{REF}$, which can result in distortion in output voltage $V_{OUT}$. For example, output current generators 230 on the multiple ones of semiconductor dies 202 may include slightly different components, such as resistors having slightly different resistance values, capacitors having slightly different capacitance values, and/or current source transistors having slightly different operating characteristics (e.g., threshold voltage, control terminal capacitance, etc.). To solve this problem, reference voltage generators 550 on semiconductor dies 202 may compensate for the difference between semiconductor dies 202. For example, in some embodiments, reference voltage generators 550 may provide reference voltages that are indifferent to the variations in components on semiconductor die(s) 202, such that DAC 520 may provide output current $I_{OUT}$ that is less or not at all affected by the variations. In some embodiments, impedance 552 may be external to semiconductor die(s) 202 such that impedance 552 is not affected by variations in semiconductor die(s) 202. Alternatively or additionally, in some embodiments, impedance 552 may be selected to compensate for variances in semiconductor die(s) 202. In some embodiments, reference voltage generators 550 may include current and/or voltage buffers. It should be appreciated that, in some embodiments, impedance 552 may be formed on semiconductor die(s) 202.

FIG. 6 is a circuit diagram illustrating DAC 520, including reference voltage generator 550, and amplifier 150, in accordance with some embodiments. Output current generator 230a and switches 240a may be configured in the manner described herein including with reference to FIG. 3A. Amplifier 150 may be configured in the manner described herein including with reference to FIGS. 1-4.

In FIG. 6, reference voltage generator 550 includes voltage buffer 554 and a current mirror including transistors 556 and 558. Voltage buffer 554 is configured to produce reference voltage $V_{REF}$ across impedance 552 to be replicated by the current mirror for output current generator 230a. For example, in FIG. 6, voltage buffer 554 includes an Op-Amp with a negative input coupled to reference generator voltage $V_{GEN}$, a positive input coupled to impedance 552 and a channel terminal of transistor 556, and an output configured to provide control voltage $V_{CTRL}$ to control terminals of transistors 556 and 558. Accordingly, voltage buffer 554 is configured to produce reference voltage $V_{REF}$ across impedance 552 such that reference voltage $V_{REF}$ is set to reference generator voltage $V_{GEN}$. Holding capacitor $C_{HOLD}$ may be configured to steady reference voltage $V_{REF}$ for output current generator 230a.

In some embodiments, transistors 556 and 558 may be configured to mirror a current flowing through impedance 552 such that a desired current flows through resistor $R_1$ of output current generator 230a. For example, transistors 556 and 558 may have a same size such that an equal current flows through impedance 552 and resistor $R_1$. Alternatively, transistors 556 and 558 may be sized based on a ratio of the resistance of impedance 552 and resistor $R_1$, such that reference voltage $V_{REF}$ is equal on both sides of the current mirror but with different currents flowing through transistors 556 and 558.

In some embodiments, $V_{GEN}$ may be set based to compensate for variations in semiconductor die(s) 202. Alternatively or additionally, in some embodiments, impedance 552 may be sized and/or selected based on a desired impedance seen looking into output current generator 230a from the current mirror.

It should be appreciated that DAC 520 may be configured for multiple amplitude levels of output current $I_{OUT}$, such as including multiple reference voltage generators. In some embodiments, the reference voltage generators may be configured to thermometer encode the reference voltages. Alternatively or additionally, in some embodiments, DAC 520 may be configured for differential inputs and outputs. For example, DAC 520 may include reference voltage generators for generating differential output current components. Alternatively or additionally, DAC 520 may be configured as a current-based DAC or a capacitor-based DAC, for example including one or more capacitors or current sources to generate output current(s) $I_{OUT}$.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

It should be appreciated that the above described transistors may be implemented in any of a variety of ways. For example, one or more of the transistors may be implemented as bipolar junction transistors or field-effect transistors (FETs), such as metal-oxide semiconductor field-effect transistors (MOSFETs), junction field-effect transistors (JFETs), heterostructure field-effect transistors (HFETs), heterojunction bipolar transistors (HBTs), and high electron mobility transistors (HEMTs). In instances where one or more transistors described herein are implemented as BJTs, the gate, source, and drain terminals described above for such transistors may be base, emitter, and collector terminals, respectively.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including", "comprising", "having", "containing" or "involving" and variations thereof herein, is meant to encompass the items listed thereafter and equivalents thereof as well as additional items.

The use of "coupled" or "connected" is meant to refer to circuit elements, or signals, that are either directly linked to one another or through intermediate components.

The terms "approximately", "substantially," and "about" may be used to mean within ±20% of a target value in some embodiments, within ±10% of a target value in some embodiments, within ±5% of a target value in some embodiments, and within ±2% of a target value in some embodiments. The terms "approximately" and "about" may include the target value.

What is claimed is:

1. A digital-to-analog converter (DAC), comprising:
   a first output current generator configured to generate, based on a first reference voltage, a first output current; and
   a first switch coupled to the first output current generator, wherein the first switch is configured for coupling to an input of an amplifier through a sense path and configured for coupling to an output of the amplifier through a force path,
   wherein:
   the DAC is configured to sense a voltage at the input through the sense path;
   the first switch is configured to provide the first output current to the output through the force path;
   the sense path comprises a first impedance including an input impedance of the amplifier;
   the force path comprises a second impedance including a resistor coupled between the first switch and the output; and
   the first impedance is greater than the second impedance.

2. The DAC of claim 1, wherein the first output current generator comprises a first resistor having a first end coupled to the first switch and a second end configured for coupling to the first reference voltage.

3. The DAC of claim 1, wherein the first output current generator comprises a first capacitor having a first end coupled to the first switch and a second end configured for coupling to the first reference voltage.

4. The DAC of claim 1, wherein the first output current generator comprises a current source having a control terminal configured to be biased by the first reference voltage and a channel terminal coupled to the first switch and configured to provide the first output current thereto.

5. The DAC of claim 1, further comprising:
   one or more semiconductor dies having the first output current generator and the first switch formed thereon; and
   the amplifier,
   wherein:
   the amplifier is external to the one or more semiconductor dies and coupled to the one or more semiconductor dies through the force path and the sense path.

6. A digital-to-analog converter (DAC), comprising:
   a first output current generator configured to generate, based on a first reference voltage, a first output current; and
   a first switch coupled to the first output current generator, wherein the first switch is configured for coupling to an input of an amplifier through a sense path and configured for coupling to an output of the amplifier through a force path, wherein:
the DAC is configured to sense a voltage at the input through the sense path;
the first switch is configured to provide the first output current to the output through the force path; and
first portions of the force and sense paths are configured in a star configuration and second portions of the force and sense paths are configured in a tree configuration, with the first portions positioned between the first switch and the second portions.

7. The DAC of claim 6, further comprising:
a second output current generator configured to generate, based on a second reference voltage, a second output current; and
a second switch coupled to the second output current generator, wherein the second switch is configured for coupling to the input of the amplifier through the sense path and configured for coupling to the output of the amplifier through the force path, wherein:
the first portions couple the first switch to the second switch; and
the second portions are configured to couple the first portions to the amplifier.

8. The DAC of claim 7, wherein the first switch and the second switch are each coupled to a summing junction configured to provide a combined output current to the output of the amplifier, the combined output current including the first and second output currents.

9. The DAC of claim 7, wherein:
the DAC is configured to convert a plurality of bits to an analog signal;
the first output current is configured to represent a first bit of the plurality of bits; and
the second output current is configured to represent a second bit of the plurality of bits.

10. The DAC of claim 8, further comprising:
third and fourth output current generators configured to generate, based on third and fourth reference voltages, third and fourth output currents; and
third and fourth switches coupled to the third and fourth output current generators, wherein:
the third and fourth switches are each coupled to the summing junction and configured such that the combined output current further includes the third and fourth output currents.

11. A digital-to-analog converter (DAC), comprising:
an output current generator configured to generate an output current based on a reference voltage; and
a reference voltage generator configured to generate and adapt the reference voltage to compensate for an impedance of the output current generator, wherein the DAC further comprises:
one or more semiconductor dies having formed thereon the output current generator and the reference voltage generator, wherein the reference voltage generator is configured to adapt the reference voltage to compensate for variations in the impedance due to process variations of the one or more semiconductor dies; and a second impedance external to the one or more semiconductor dies and configured to set the reference voltage.

12. The DAC of claim 11, wherein the second impedance comprises a resistor.

13. The DAC of claim 11, wherein the second impedance comprises a capacitor.

14. A digital-to-analog converter (DAC), comprising:
an output current generator configured to generate an output current based on a reference voltage; and
a reference voltage generator configured to generate and adapt the reference voltage to compensate for an impedance of the output current generator, wherein the DAC further comprises:
a plurality of output current generators, including:
the output current generator; and
a second output current generator configured to generate a second output current based on a second reference voltage; and
a plurality of reference voltage generators, including:
the reference voltage generator; and
a second reference voltage generator configured to generate and adapt the second reference voltage to compensate for an impedance of the second output current generator.

15. The DAC of claim 14, wherein:
the plurality of output current generators comprise unary-weighted resistors each having a first end coupled to at least one of a plurality of reference voltages, the plurality of reference voltages including:
the reference voltage; and
the second reference voltage; and
the plurality of reference voltage generators are configured to thermometer-encode the plurality of reference voltages.

16. The DAC of claim 15, further comprising:
a plurality of switches coupled between the unary-weighted resistors and a summing junction,
wherein the summing junction is configured for coupling to an amplifier so as to provide a combined output current to the amplifier, the combined output current including:
the output current; and
the second output current.

17. A digital-to-analog converter (DAC), comprising:
an output current generator configured to generate an output current based on a reference voltage; and
a reference voltage generator configured to generate and adapt the reference voltage to compensate for an impedance of the output current generator, wherein the DAC further comprises:
a current mirror, including:
a first side having the reference voltage generator thereon, wherein the reference voltage generator is configured to produce the reference voltage on the first side; and
a second side having the output current generator thereon, wherein the current mirror is configured to reproduce the reference voltage on the second side for the output current generator.

* * * * *